(12) United States Patent
Lin et al.

(10) Patent No.: US 6,798,296 B2
(45) Date of Patent: Sep. 28, 2004

(54) WIDE BAND, WIDE OPERATION RANGE, GENERAL PURPOSE DIGITAL PHASE LOCKED LOOP ARCHITECTURE

(75) Inventors: Heng-Chih Lin, Plano, TX (US); Baher S. Haroun, Allen, TX (US); Tiang Tun Foo, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/292,225

(22) Filed: Nov. 12, 2002

(65) Prior Publication Data

US 2003/0184394 A1 Oct. 2, 2003

Related U.S. Application Data

(60) Provisional application No. 60/368,240, filed on Mar. 28, 2002.

(51) Int. Cl.[7] ................................................. H03L 7/00
(52) U.S. Cl. .......................................... 331/1 A; 331/34
(58) Field of Search ......................... 331/1 A, 34, 100, 331/16, 18; 375/376

(56) References Cited

U.S. PATENT DOCUMENTS

| 5,444,459 | A | * | 8/1995 | Moriyasu | 345/440.1 |
|---|---|---|---|---|---|
| 5,506,875 | A | * | 4/1996 | Nuckolls et al. | 375/375 |
| 6,028,488 | A | * | 2/2000 | Landman et al. | 331/1 A |
| 6,181,168 | B1 | * | 1/2001 | Zarubinsky et al. | 327/12 |
| 6,208,211 | B1 | * | 3/2001 | Zipper et al. | 331/17 |
| 6,369,661 | B1 | * | 4/2002 | Scott et al. | 331/45 |
| 6,414,555 | B2 | * | 7/2002 | Staszewski et al. | 331/18 |

* cited by examiner

Primary Examiner—Robert Pascal
Assistant Examiner—Joseph Chang
(74) Attorney, Agent, or Firm—Frederick J. Telecky, Jr.; W. James Brady, III (57) ABSTRACT

A wide band, wide operating range, general purpose digital phase locked loop (PLL) runs in the digital domain except for the associated Time Digitizer (T2D) and Digitally-Controlled-Oscillator (DCO). By calibrating the T2D and DCO on the fly, a constant PLL loop BW is achieved by using the calibrated Phase Frequency Detection (PFD) and DCO information to normalize the control loop correction regardless of the input clock frequency, power supply voltage, processing and temperature variations. PLL loop BW is completely decoupled from the operating conditions and semiconductor device variation. This means that the PLL loop BW can be chosen very aggressively to reject the noise, thus achieving a low jitter, high performance PLL. Furthermore, since this PLL can reliably operate over a wide operating range, it is a one-design-fits-all general purpose PLL.

22 Claims, 7 Drawing Sheets

WIDE BAND, WIDE OPERATION RANGE, GENERAL PURPOSE DIGITAL PHASE LOCKED LOOP ARCHITECTURE

CLAIM TO PRIORITY OF PROVISIONAL APPLICATION

The application claims priority under 35 U.S.C. § 119(e)(1) of provisional application Ser. No. 60/368,240, filed Mar. 28, 2002, by Heng-Chih Lin, Baher S. Haroun and Tim Foo.

BACKGROUND OF THE INVENTION

1. Field of the Invention

This invention relates generally to digital phase lock loops, and more particularly to a wide band, wide operation range, general purpose digital phase locked loop (PLL) architecture.

2. Description of the Prior Art

Portable ultra large scaled integrated circuit (VLSI) systems require efficient power management schemes such as power supply voltage scaling, and clock frequency scaling on the fly to achieve optimal system/power performance. Phase locked loops, which generate the system clock, thus must be able to work under all these operating conditions and still maintain the loop stability. This implies that the PLL loop bandwidth has to be designed on the order of 10× smaller than the smallest possible clock frequency. The scaling of power supply voltage on the fly further complicates the design by changing the semiconductor device parameters. The combined effect is that a designer usually must take a conservative approach and design a PLL which has a very low loop bandwidth (BW). On the other hand, the integration of a PLL and a large digital system generally has a large power supply and substrate noise injection associated with the digital circuitry, and thus, the large PLL output clock jitter. In order to reject those noises, a PLL is required to have a loop BW as large as possible. Such stability-performance trade offs create a great challenge on traditional analog PLL designs.

It is therefore advantageous and desirable to provide a completely digital PLL architecture capable of successfully addressing the foregoing stability-performance trade offs.

SUMMARY OF THE INVENTION

The present invention is directed to a wide band, wide operating range, general purpose digital phase locked loop (PLL) architecture. The entire PLL is running in the digital domain except for the Time Digitizer (T2D) and Digitally-Controlled-Oscillator (DCO). By calibrating the T2D and DCO on the fly, a constant PLL loop BW is achieved by using the calibrated Phase Frequency Detection (PFD) and DCO information to normalize the control loop correction regardless of the input clock frequency, power supply voltage, processing and temperature variations. PLL loop BW is completely decoupled from the operating conditions and semiconductor device variation. This means that the PLL loop BW can be chosen very aggressively to reject the noise, thus achieving a low jitter, high performance PLL. Furthermore, since this PLL can reliably operate over a wide operating range, it is a one-design-fits-all general purpose PLL.

According to one embodiment, a digital phase locked loop (PLL) comprises: a phase frequency detector configured to measure a difference (phase error) between a reference clock and a feedback clock and generate up and down pulses there from; a time digitizer configured to convert the phase error between the reference clock and the feedback clock into a phase error code in response to the up and down pulses; a digital controller configured to generate a digitally controlled oscillator (DCO) control code in response to the phase error code; and a DCO configured to generate an output clock in response to the DCO control code and further configured to generate the feedback clock, such that a substantially constant PLL bandwidth is achieved regardless of reference clock, power supply voltage, processing and temperature variations.

According to another embodiment, a digital phase locked loop (PLL) comprises: means for measuring a difference (phase error) between a reference clock and a feedback clock and generating up and down pulses there from; means for converting the phase error between the reference clock and the feedback clock into a phase error code in response to the up and down pulses; means for generating a digitally controlled oscillator (DCO) control code in response to the phase error code; and means for generating an output clock in response to the DCO control code and further configured to generate the feedback clock, such that a substantially constant PLL bandwidth is achieved regardless of reference clock, power supply voltage, processing and temperature variations.

According to yet another embodiment, a method of controlling a phase locked loop (PLL) bandwidth comprises the steps of: providing a digitally controlled PLL comprising: a phase frequency; a time digitizer; a digital controller; and a DCO; measuring a difference (phase error) between a reference clock and a feedback clock and generating up and down pulses there from via the phase frequency detector; converting the phase error between the reference clock and the feedback clock into a phase error code in response to the up and down pulses via the time digitizer; generating a digitally controlled oscillator (DCO) control code in response to the phase error code via the digital controller; and generating an output clock and the feedback clock in response to the DCO control code such that a substantially constant PLL bandwidth is achieved regardless of reference clock, power supply voltage, processing and temperature variations.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Embedded phase lock loops have become an integral part of any digital or analog system which requires accurate clocks (e.g., digital signal processor (DSP) in wireless communications). In order to support a wide customer base and communication standard, an all digital phase lock loop (ADPLL) was found by the present inventors to provide an easy path for integration with any clocked system (e.g., DSPs) in a deep-submicron CMOS process Other incentives were found to include: 1. a fast design cycle; 2. easy process migration and more scalable area; and 3. ease of testing. Designing an ADPLL that has a fast acquisition and lock time, and yet has a very predictable behavior across a wide band of input versus output frequencies and a wide range of operating conditions, is however, not trivial. The detailed description of the preferred embodiments discussed herein below with reference to FIGS. 1–13 are directed to an ADPLL that is able to achieve a remarkable lock time, stability and robustness, regardless of the constraints discussed herein before by using a 2nd Order Type II digital control loop with self calibration and fast acquisition techniques.

Figure 1:
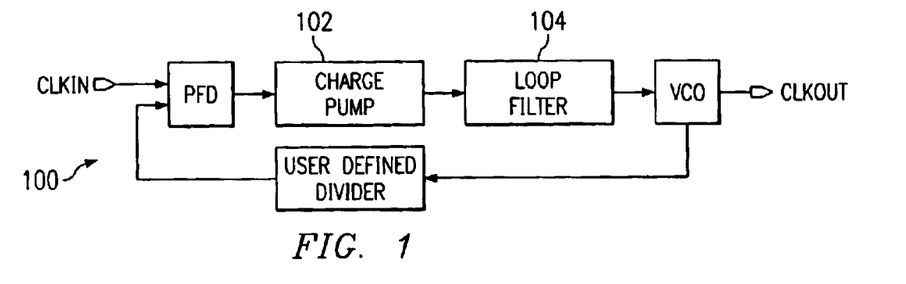
FIG. 1 is a simplified block diagram illustrating a typical analog phase lock loop system known in the art.

FIG. 1 shows a conventional Phase Lock Loop (PLL) 100. In a digital PLL, the charge pump 102 and the loop filter 104 are replaced with a digital control circuit.

Figure 2:
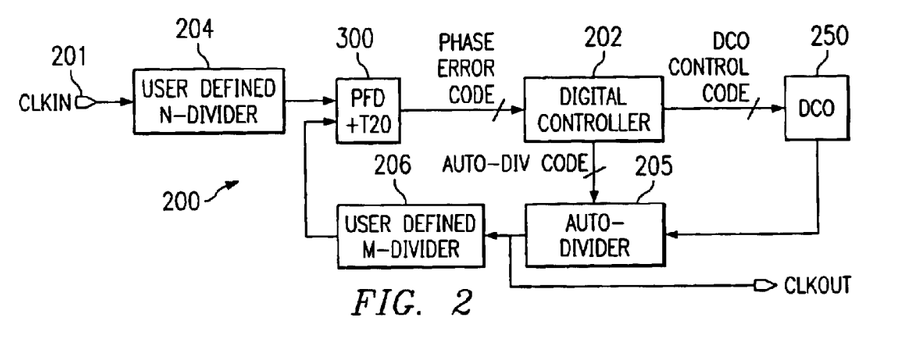
FIG. 2 is a simplified block diagram illustrating an all digital phase lock loop system.

FIG. 2 is a simplified block diagram illustrating an all digital phase lock loop (ADPLL) system 200. The digital controller 202 acts on the phase frequency difference to control the output frequency of the PLL 200. In order to support a wide range of frequency synthesis, this ADPLL system 200 includes a user defined N-divider 204 to further divide the input clock, CLKIN 201. As a fractional frequency synthesizer, the possible output clock for this ADPLL system 200 can be described as CLKOUT=M/N*CLKIN, wherein N is associated with N-Divider 204 and M is associated with M-Divider 206. On each rising edge of each reference clock, a new DCO 250 code is set to achieve a DCO 250 output clock frequency. The DCO 250 output clock then goes through a divider chain 205, 206 before it is fed back to the PFD shown in block 300. Within half a reference clock, the phase difference between the reference clock and the feedback clock is recorded as the phase error code. The digital controller 202 will respond to the phase error code and determine the next appropriate DCO 250 code to be set on the rising edge of the next reference clock, thus guiding the ADPLL 200 to achieve the desired output clock frequency.

The ADPLL system 200 architecture is based on a fixed-point phase-frequency domain structure. This architecture importantly centers around a type II second order digital control system. This second order control system takes into account both phase and frequency difference. The ADPLL system 200 is implemented as described below with reference to FIGS. 3–13.

A. Phase Frequency Detector

Figure 3:
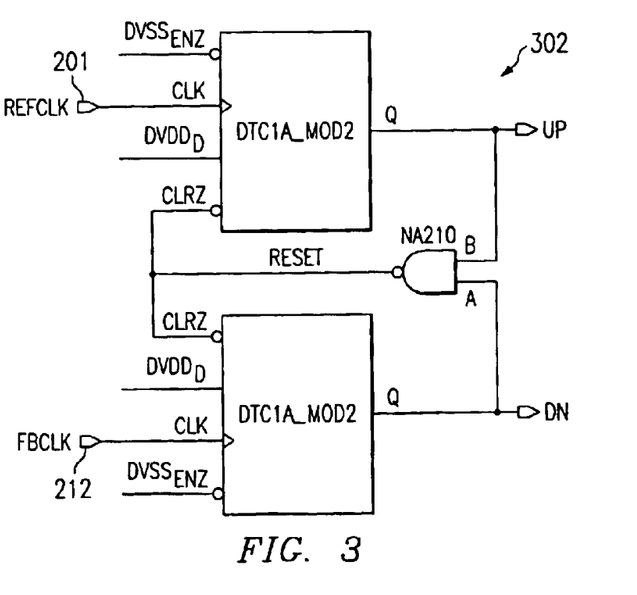
FIG. 3 is a schematic diagram illustrating the phase frequency detector implemented in FIG. 2.

FIG. 3 shows the Phase Frequency Detection(PFD) circuit 302 implemented in this ADPLL system 200. The PFD circuit 302 measures the phase differences between the reference clock 201 and the feedback clock 212 generated by the ADPLL system 200. The magnitude of the phase difference is represented as the width of the UP and DOWN pulses.

B. Time Digitizer

Figure 4:
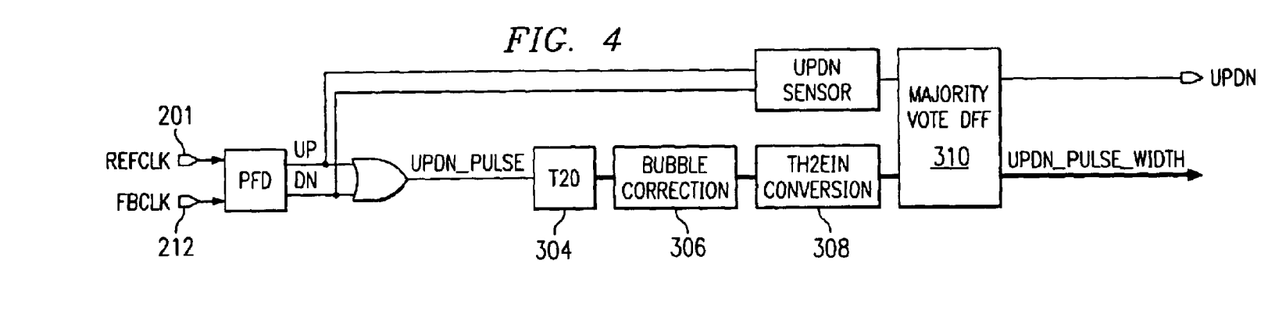
FIG. 4 is a more detailed block diagram illustrating the phase frequency detector and time digitizer shown in FIG. 2.

Phase error between input clock 201 and feedback clock 212 is measured and converted from time to digital code using the Time Digitizer (T2D) circuit 304 shown in FIG. 4. This is a significant advantage compared to a VCO using analog control voltage because once the T2D 304 conversion is completed, the digital code will not be corrupted by noise; and the subsequent control algorithm can be carried out in the digital domain. This architecture then provides a superior implementation in a high gate density deep-submicron CMOS process.

ADPLL system 200 was found by the present inventors to accommodate a wide range of system (e.g., DSP platforms) that require a wide range of input frequencies. The T2D circuit 304 is carefully designed to have fine resolution in high input frequency applications without sacrificing the wide delay range required to effectively operate in low input frequency applications without saturating the delay chain.

Special care is required after the time digitizer 304 to minimize potential glitches on the phase error code. Standard bubble correction 306 and a thermometer to binary conversion circuits 308 follow the time digitizer 304 as shown in FIG. 4. A "Majority Vote" circuit 310 using high speed flip-flops is used to latch the digitized phase error code. This time digitized phase error code is later translated into a delay code using a lookup table implemented in the digital controller 202. Using the binary coded representation of the phase error was found by the present inventors to reduce the area and signal routing between the T2D circuit 304 and the digital controller 202.

C Digital Controller

Figure 5:
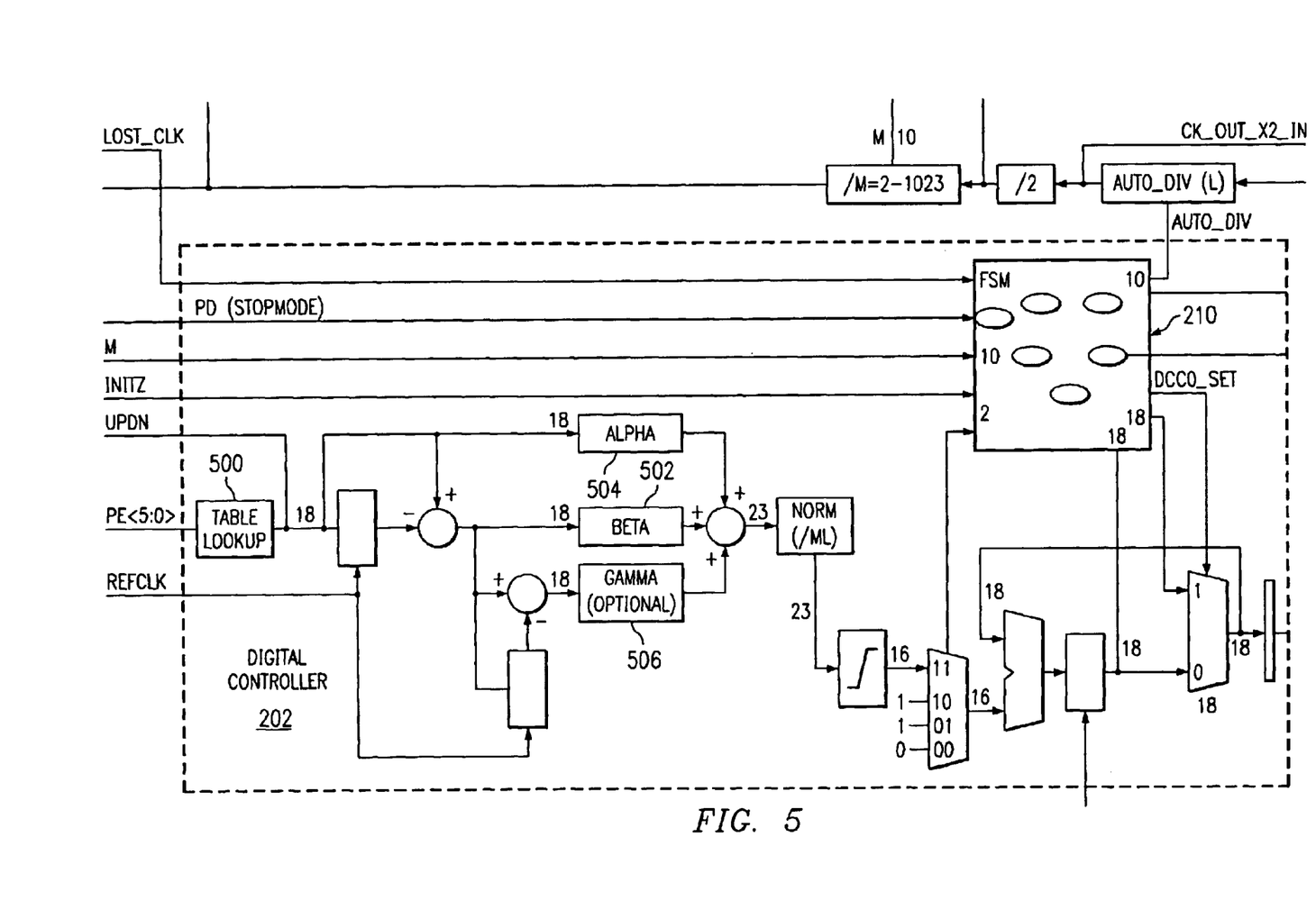
FIG. 5 illustrates a digital controller suitable for controlling the all digital phase lock loop shown in FIG. 2.

The operation of the ADPLL system 200 is powered by a digital controller (DC) 202 equipped with a second order type II control system as stated herein before. A detailed configuration of the digital controller 202 is illustrated in FIG. 5. A binary phase error code from T2D 304 is mapped to delay time units (Dmin) using a lookup table 500 as stated herein before. The output of the lookup table 500 is used to provide the exact delay time unit information used in the normalization step that is described in more detail herein below.

Differencing the phase error code in the digital domain allows extraction of frequency error information. In the second order control system, frequency error serves as a coarse tuning control while phase error serves as fine tuning control. The coarse tuning gain factor, beta 502, and fine tuning gain factor, alpha 504, are set to 32 and 1 respectively.

Having the entire control system 202 designed in the digital domain allows a third order tuning factor, gamma 506, to be easily integrated into the control loop as the need arises.

Complimenting the complex control algorithm implemented in the digital controller 202 is the synchronous Finite State Machine (FSM) 510, which operates as the heart of the controller 202. The FSM 510 functions can be categorized into, but not limited to six main states including RESET, CALIBRATION, TRACKING, LOCK, STOPMODE and LIMP.

Figure 6:
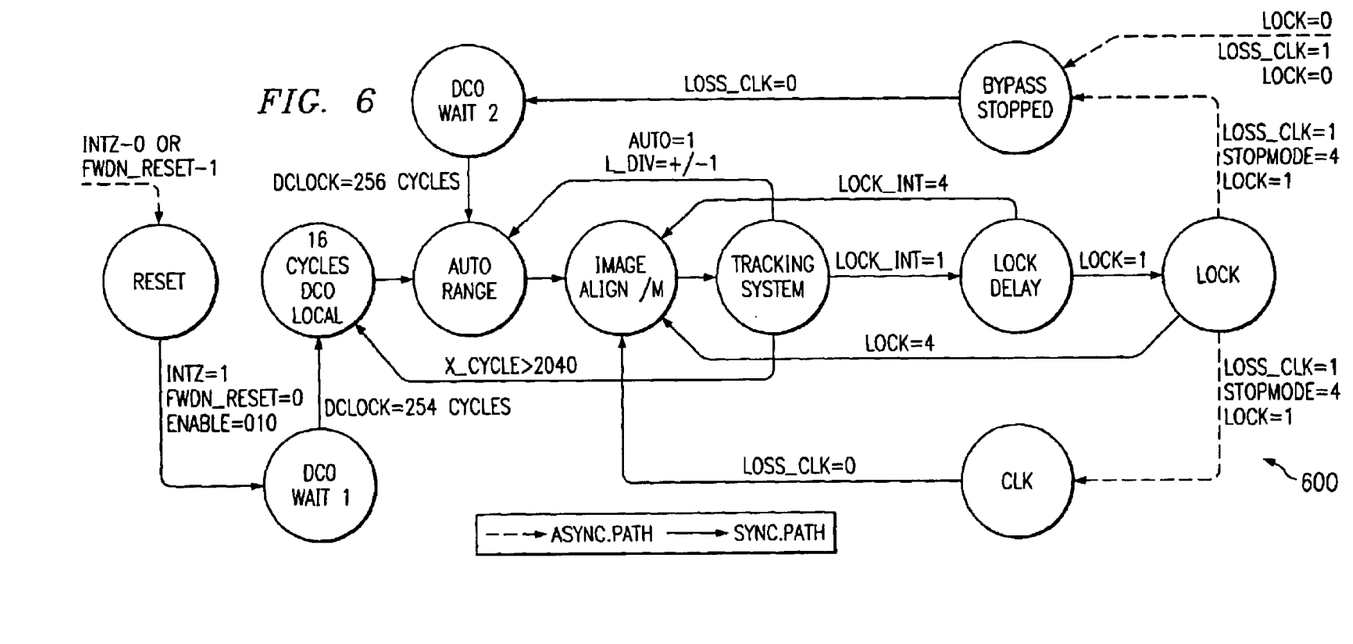
FIG. 6 is a finite state machine diagram for the digital controller shown in FIG. 5.
Figure 7A:
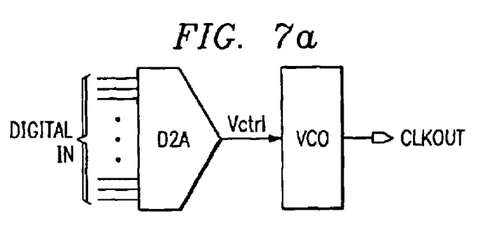
FIG. 7(a) shows a common digitally controlled oscillator that employs a digital to analog converter and a voltage controlled oscillator.
Figure 7B:
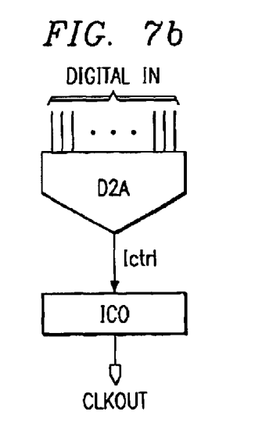
FIG. 7(b) shows a common digitally controlled oscillator that employs a digital to analog converter and a current controlled oscillator.
Figure 7C:
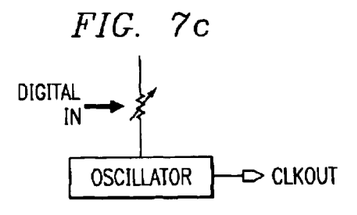
FIG. 7(c) shows a common digitally controlled oscillator that employs a digitally controlled resistance.
Figure 7D:
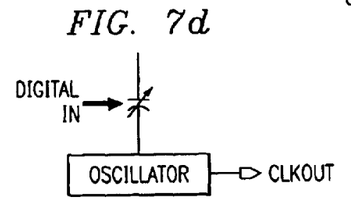
FIG. 7(d) shows a common digitally controlled oscillator that employs a digitally controlled capacitance.

FIG. 6 shows the FSM 510 flow diagram 600 that is believed by the present inventors to be extremely comprehensive and robust to accommodate a wide band and range of operations. The CALIBRATION state calibrates all the PVT effects associated with the specific operation by collecting the Kdco and Kt2d gain information that is used to normalize the control loop as described in more detail herein below. The STOPMODE allows the ADPLL system 200 to enter into a deep sleep mode to conserve power, while the UMP mode allows the system 200 to be gracefully shut down in the event of losing the input clock 201.

At each reference clock cycle, a new DCO correction step is computed based on the phase error code and its derivatives. This correction step is first normalized with a normalization factor that is acquired through calibrations. The normalization factor is implemented using a lookup table which stores the corresponding shift value. Instead of using a multiplier or divider, the normalization is done through a shifter using the values stored in the lookup table. Before the normalized DCO correction is added to the current DCO code, it is passed through saturation logic such that the correction step is clamped at some predetermined (e.g., 3%) maximum.

D. Digital Controlled Oscillator

A Digital Controlled Oscillator(DCO) for use with ADPLL system 200 can be implemented in many ways. A Digital to Analog Converter (DAC) is typically used to convert the digital code into an appropriate voltage or current which directly controls the oscillation frequency. Other implementations digitally control the effective R or C of the ring oscillators. These architectures are presented in FIGS. 7(a)–7(d).

Designing a linear frequency versus control code in a low voltage deep-submicron CMOS process, as stated herein before, is a challenging task. The DCO must guarantee oscillation over a wide range of PVT conditions. Further, the DCO frequency vs. code curve must be monotonic across all PVT conditions to avoid any localized valley which can trap the DCO into a small range of possible oscillation frequencies. The detailed discussion herein below more fully describes the theory of operation associated with the particular embodiments of the present invention described herein above in order to achieve the foregoing results.

A. Stability Versus Jitter Trade Off

In order to reject the DCO jitter from supply noise, the PLL loop bandwidth needs to be as large as possible, subject to ⅒ of the reference frequency upper limit. A PLL designer usually has to take a conservative approach in BW design in order to guarantee stability over PVT variations, thus sacrificing the jitter performance. By adopting a calibration method described herein below, a relatively constant PLL loop BW is maintained over all PVT variations, which allows an aggressive approach on loop BW design to reject the DCO jitter.

B. Self Calibration

The benefits of self calibration result in wide band input frequency operation range, even with PVT (process, voltage, temperature) variations. Wide band input frequency directly affects how the control loop responds in all conditions as discussed above. PVT variations are the most important factors that cause integrated circuits to function in one case but fail in others. It is therefore absolutely necessary to build some intelligence into the ADPLL 200 regarding the operating environments. This intelligence is collected from the calibrated data used to guide the DCO control loop to be more accurate, robust and stable.

Figure 8:
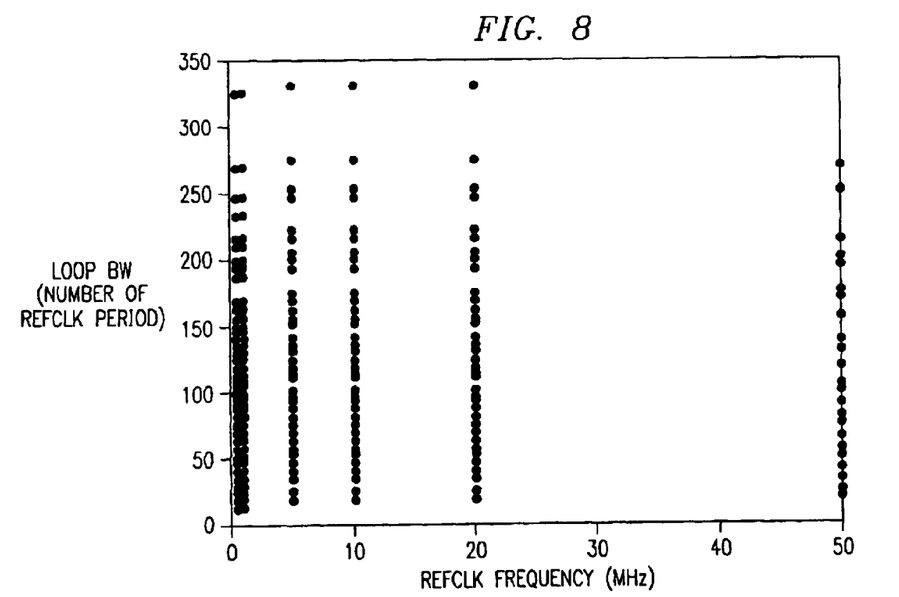
FIG. 8 shows the PLL loop BW with very basic (M×L) normalization under different operating conditions for the all digital phase lock loop shown in FIG. 2.
Figure 9:
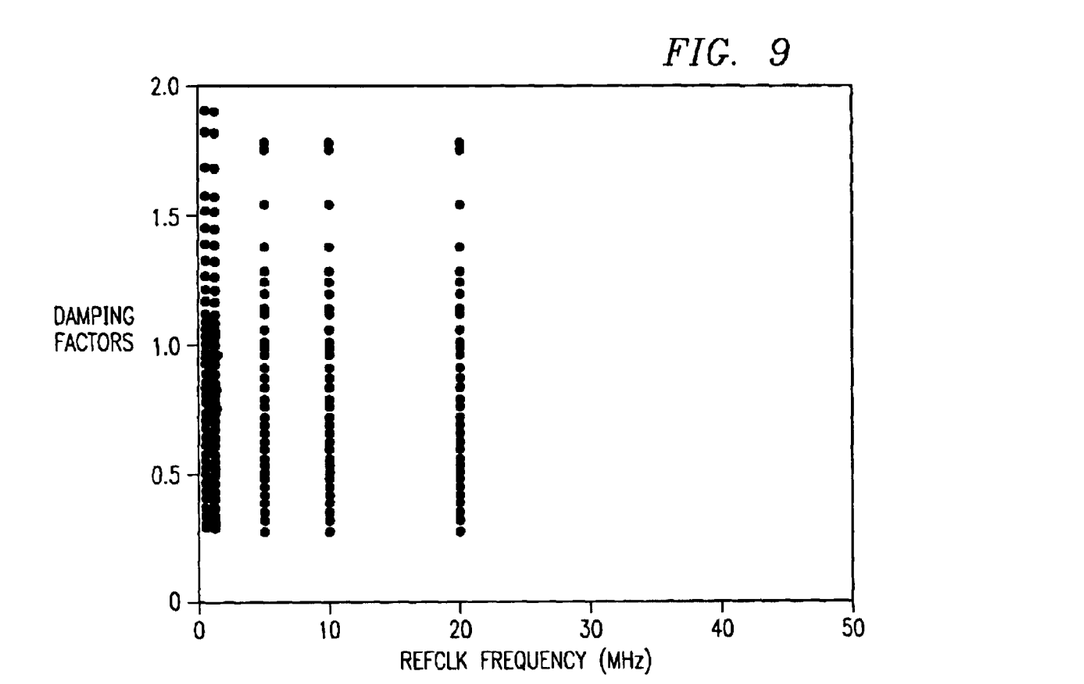
FIG. 9 shows the PLL loop damping factor with very basic (M×L) normalization under different operating conditions for the all digital phase lock loop shown in FIG. 2.

FIG. 8 shows a 10× variation in the PLL loop BW tabulation for a very basic (M×L) normalization, where L is the auto-divider 205 value in FIG. 2, and without taking into account how PVT variations affect Kdco and Kt2d discussed herein before. The corresponding PLL damping factor is shown in FIG. 9

This wide variation in PLL loop BW and damping factor will result in a PLL that will behave unpredictably under different operating conditions. In order to constrain such wide variations, PVC effects on the circuits must be well controlled through calibration Since the majority of the ADPLL 200 is in the digital domain, only DCO (enumerated 250 in FIG. 2) and T2D circuits (enumerated 304 in FIG. 4) are needed for calibration as described herein below.

T2D kt2d calibration:

The T2D 304 delay chain is calibrated with respect to a preset DCO 250 output frequency to offset the PVT variations. In this calibration step, one DCO 250 output clock pulse is sent to the PFD 302 and the corresponding T2D 304 code is recorded. This code is used in the DCO 250 code normalization computation as discussed below.

DCO Kdco Calibration:

At a known DCO code, the DCO 250 output clock frequency describes the Kdco associated with a particular operating condition. Over a period of pre-determined (say, 16) reference clock periods, the DCO 250 output frequency ratio over the reference frequency is computed.

C. Normalization

Figure 10:
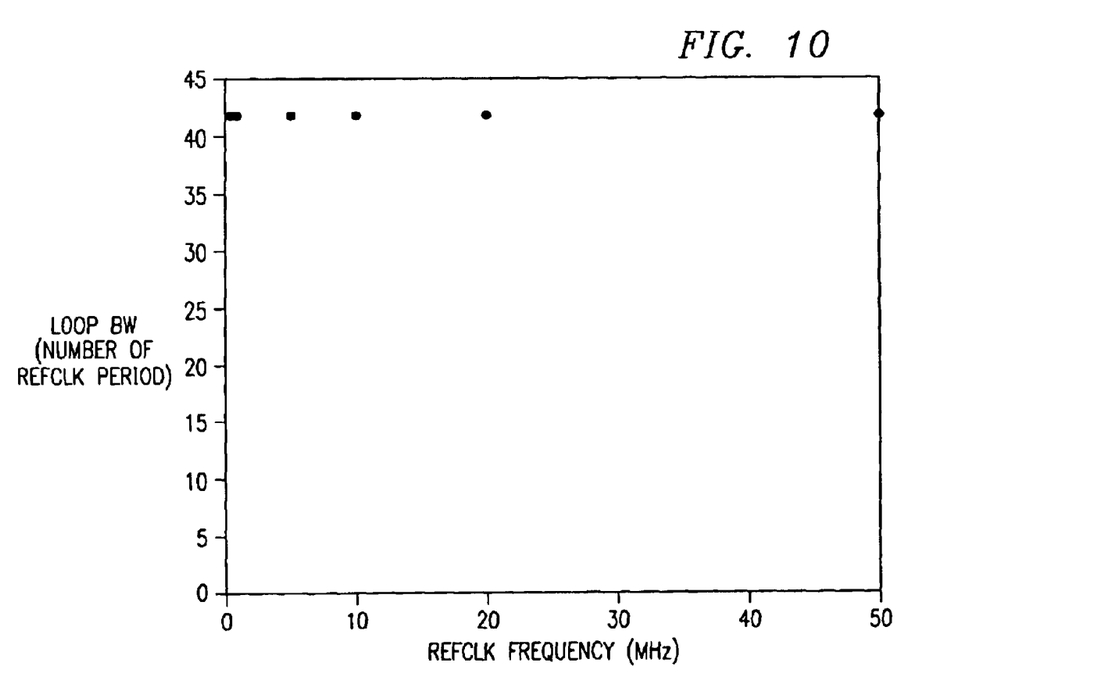
FIG. 10 shows the PLL loop BW with DCO 2-point calibration and normalization under different operating conditions for the all digital phase lock loop shown in FIG. 2.
Figure 11:
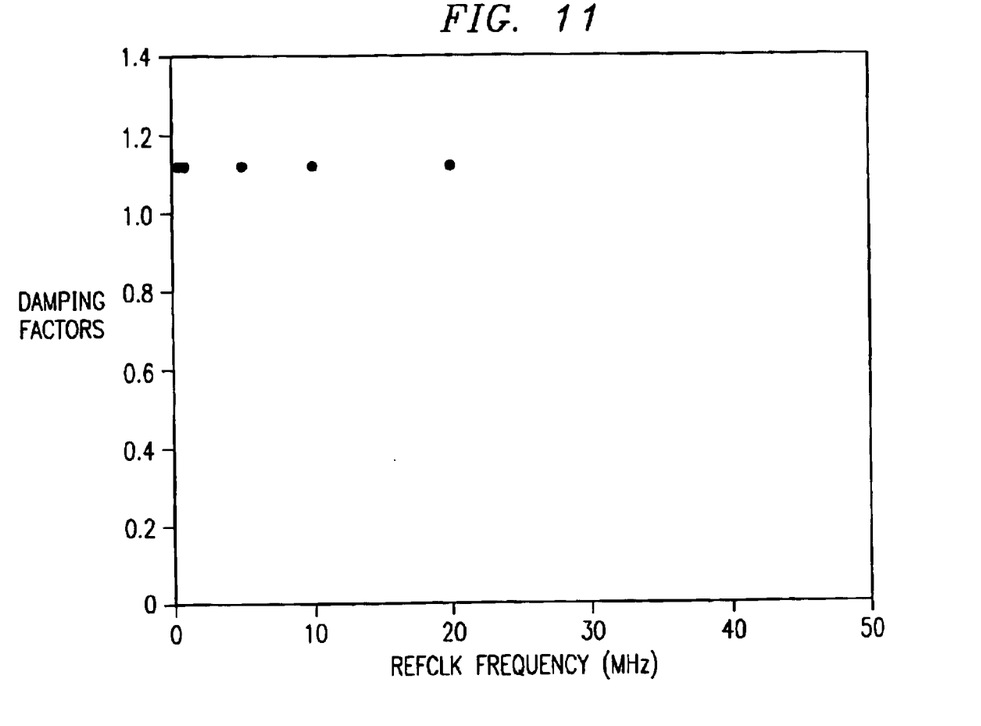
FIG. 11 shows the PLL loop damping factor with DCO 2-point calibration and normalization under operating conditions for the all digital phase lock loop shown in FIG. 2.

Normalization was found by the present inventors to be necessary to enable ADPLL system 200 to operate within a wide frequency band and over a wide operating range of PVT conditions. The embodiments described herein demonstrate that a constant loop bandwidth and damping factor can be maintained regardless of the input or output frequencies, or PVT variations through proper calibration of the Kt2d and Kdco in an ADPLL. A predictable, robust and stable ADPLL 200 is accordingly achieved FIGS. 10 and 11 show the PLL loop BW and damping factor respectively when a 2-point calibration for the Kdco along with Kt2d calibrations are done properly. Further, information attained from proper calibration can be used to normalize the phase frequency lock condition to a predefined percentage, regardless of input clock frequency and PVT variations.

The present inventors also found that lookup table techniques could be implemented, if desired, to realize the complex normalization factor such that a reduction in hardware and a shortened data path delay could be achieved. One embodiment of the normalization lookup table was found to use only 4096×5 bits total with an accuracy of at least 35%.

D. Speedup Lock Time

The ADPLL system 200 architecture described herein advantageously speeds up the lock time using features such as DCO code prediction, phase alignment and proper T2D 304 implementation. DCO code prediction was found to establish the DCO oscillation frequency to within 12.5% of the target frequency. Phase alignment was found to establish a phase difference between the input clock and the feedback clock to within 25% in the target applications. Phase alignment was also found to shorten the time to re-lock after the ADPLL 200 came out of the sleep mode. Those skilled in the digital PLL art will appreciate the T2D 304 can also be implemented, if desired, in any manner that guarantees the control loop will be alive by keeping the loop correction active even when the phase error pulse has saturated the T2D 304 delay chain in extra low input frequency applications.

In summary explanation, an ADPLL 200 has been described that is substantially immune to PVT variations.

The ADPLL 200 uses proper calibration and normalization of the PLL to ease the effects of input frequency and PVT variations. The ADPLL 200 behaves in a very predictable manner regardless of the operating conditions.

Figure 12:
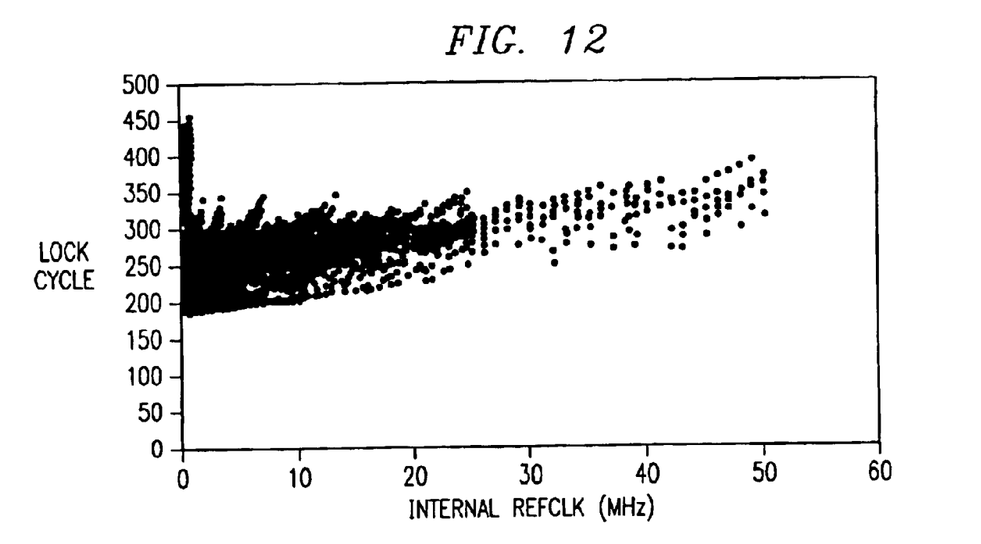
FIG. 12 shows the PLL cycle to lock for various input frequencies (with 0.1% RMS jitter on the DCO clock and input clock) for the all digital phase lock loop shown in FIG. 2.
Figure 13:
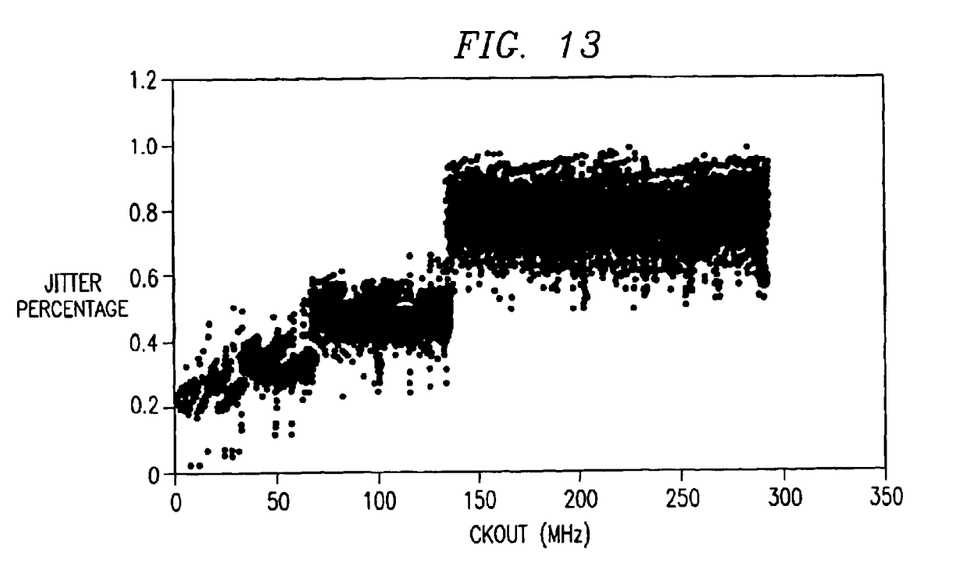
FIG. 13 shows the PLL output clock jitter for various output frequencies (with 0.1% RMS jitter on the DCO clock and input clock) for the all digital phase lock loop shown in FIG. 2.

FIGS. 12 and 13 show simulation results for the respective cycle-to-lock and output clock jitter in a test setup with 0.1% RMS jitter on the input clock as well as the DCO output clock in behavioral models. Across a wide range of output clock frequencies, from—0.25 MHz to 290 MHz, jitter performances are contained in a well-defined range of 1.2%. The reference cycle to lock is also consistently maintained within 400 cycles, except at sub 1 MHz input frequencies where the T2D 304 delay chain is saturated.

In view of the above, it can be seen the present invention presents a significant advancement in the art of all digital phase lock loops. Further, this invention has been described in considerable detail in order to provide those skilled in the PLL art with the information needed to apply the novel principles and to construct and use such specialized components as are required.

Further, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A digital phase locked loop (PLL) comprising:
   a phase frequency detector configured to measure a difference (phase error) between a reference clock and a feedback clock and generate up and down pulses there from;
   a time digitizer configured to convert the phase error between the reference clock and the feedback clock into a phase error code in response to the up and down pulses;
   a digital controller configured to generate a digitally controlled oscillator (DCO) control code in response to the phase error code; and
   a DCO configured to generate an output clock in response to the DCO control code and further configured to generate the feedback clock, such that a substantially constant PLL bandwidth is achieved regardless of reference clock, power supply voltage, processing and temperature variations;
   wherein the digital controller comprises a second order type II control system.

2. The digital PLL according to claim 1 wherein the second order type II control system comprises a lookup table and is configured to map the phase error code into delay time units in response to lookup table information.

3. The digital PLL according to claim 1 wherein the second order type II control system comprises a coarse tuning control that is responsive to frequency errors.

4. The digital PLL according to claim 1 wherein the second order type II control system comprises a fine tuning control that is responsive to phase errors.

5. The digital PLL according to claim 1 wherein the second order type II control system comprises a synchronous finite state machine algorithm operational to calibrate process, voltage and temperature effects associated with predetermined operations.

6. The digital PLL according to claim 1 wherein the second order type II control system comprises a synchronous finite state machine algorithm operational to calibrate DCO gain and time digitizer gain on-the-fly.

7. A digital phase locked loop (PLL) comprising:
   means for measuring a difference (phase error) between a reference clock and a feedback clock and generating up and down pulses in digital form there from;
   means for converting the phase error between the reference clock and the feedback clock into a phase error code in response to the up and down pulses;
   means for generating a digitally controlled oscillator (DCO) control code in response to the phase error code; and
   means for generating an output clock in response to the DCO control code and further configured to generate the feedback clock, such that a substantially constant PLL bandwidth is achieved regardless of reference clock, power supply voltage, processing and temperature variations;
   wherein the means for generating a digitally controlled oscillator (DCO) control code in response to the phase error code comprises a digital second order type II control system.

8. The digital PLL according to claim 7 wherein the means for measuring a difference (phase error) between a reference clock and a feedback clock and generating up and down pulses there from comprises a phase frequency detector.

9. The digital PLL according to claim 7 wherein the means for converting the phase error between the reference clock and the feedback clock into a phase error code in response to the up and down pulses comprises a time digitizer.

10. The digital PLL according to claim 7 wherein the means for generating a digitally controlled oscillator (DCO) control code in response to the phase error code comprises a digital second order type II control system.

11. The digital PLL according to claims 7 wherein the digital second order type II control system comprises a lookup table and is configured to map the phase error code into delay time units in response to lookup table information.

12. The digital PLL according to claim 7 wherein the digital second order type II control system comprises a coarse tuning control that is responsive to frequency errors.

13. The digital PLL according to claim 7 wherein the digital second order type II control system comprises a fine tuning control that is responsive to phase errors.

14. The digital PLL according to claim 7 wherein the digital second order type II control system comprises a synchronous finite state machine algorithm operational to calibrate process, voltage and temperature effects associated with predetermined operations.

15. The digital PLL according to claim 7 wherein the digital second order type II control system comprises a synchronous finite state machine algorithm operational to calibrate DCO gain and time digitizer gain on-the-fly.

16. The digital PLL according to claim 7 wherein the means for generating an output clock in response to the DCO control code and further configured to generate the feedback clock, such that a substantially constant PLL bandwidth is achieved regardless of reference clock, power supply voltage, processing and temperature variations comprises a ring oscillator controlled in response to a digitally controlled variable capacitance.

17. A digital phase locked loop (PLL) comprising:
   means for measuring a difference (phase error) between a reference clock and a feedback clock and generating up and down pulses in digital form there from;
   means for converting the phase error between the reference clock and the feedback clock into a phase error code in response to the up and down pulses;

means for generating a digitally controlled oscillator (DCO) control code in response to the phase error code; and means for generating an output clock in response to the DCO control code and further configured to generate the feedback clock, such that a substantially constant PLL bandwidth is achieved regardless of reference clock, power supply voltage, processing and temperature variations;

wherein the means for generating an output clock in response to the DCO control code and further configured to generate the feedback clock, such that a substantially constant PLL bandwidth is achieved regardless of reference clock, power supply voltage, processing and temperature variations comprises a voltage controlled oscillator driven by a digital to analog converter.

18. A digital phase locked loop (PLL) comprising:

means for measuring a difference (phase error) between a reference clock and a feedback clock and generating up and down pulses in digital form there from;

means for converting the phase error between the reference clock and the feedback clock into a phase error code in response to the up and down pulses;

means for generating a digitally controlled oscillator (DCO) control code in response to the phase error code; and means for generating an output clock in response to the DCO control code and further configured to generate the feedback clock, such that a substantially constant PLL bandwidth is achieved regardless of reference clock, power supply voltage, processing and temperature variations;

wherein the means for generating an output clock in response to the DCO control code and further configured to generate the feedback clock, such that a substantially constant PLL bandwidth is achieved regardless of reference clock, power supply voltage, processing and temperature variations comprises a current controlled oscillator driven by a digital to analog converter.

19. A digital phase locked loop (PLL) comprising:

means for measuring a difference (phase error) between a reference clock and a feedback clock and generating up and down pulses in digital form there from;

means for converting the phase error between the reference clock and the feedback clock into a phase error code in response to the up and down pulses;

means for generating a digitally controlled oscillator (DCO) control code in response to the phase error code; and means for generating an output clock in response to the DCO control code and further configured to generate the feedback clock, such that a substantially constant PLL bandwidth is achieved regardless of reference clock, power supply voltage, processing and temperature variations;

wherein the means for generating an output clock in response to the DCO control code and further configured to generate the feedback clock, such that a substantially constant PLL bandwidth is achieved regardless of reference clock, power supply voltage, processing and temperature variations comprises a ring oscillator controlled in response to a digitally controlled variable resistance.

20. A method of controlling a phase locked loop (PLL) bandwidth, the method comprising the steps of:

providing a digitally controlled PLL comprising:
a phase frequency detector;
a time digitizer;
a digital controller; and
a DCO;

measuring a difference (phase error) between a reference clock and a feedback clock and generating up and down pulses there from via the phase frequency detector;

converting the phase error between the reference clock and the feedback clock into a phase error code in response to the up and down pulses via the time digitizer;

generating a digitally controlled oscillator (DCO) control code in response to the phase error code via the digital controller; and generating an output clock and the feedback clock in response to the DCO control code such that a substantially constant PLL bandwidth is achieved regardless of reference clock, power supply voltage, processing and temperature variations;

wherein the step of generating a digitally controlled oscillator (DCO) control code in response to the phase error code via the digital controller comprises the steps of converting the measurements to digital signals, and implementing bubble correction, thermometer to binary conversion, and majority voting operations respectively on the digital signals.

21. A method of controlling a phase locked loop (PLL) bandwidth, the method comprising the steps of:

providing a digitally controlled PLL comprising:
a phase frequency detector;
a time digitizer;
a digital controller; and
a DCO;

measuring a difference (phase error) between a reference clock and a feedback clock and generating up and down pulses there from via the phase frequency detector;

converting the phase error between the reference clock and the feedback clock into a phase error code in response to the up and down pulses via the time digitizer;

generating a digitally controlled oscillator (DCO) control code in response to the phase error code via the digital controller; and generating an output clock and the feedback clock in response to the DCO control code such that a substantially constant PLL bandwidth is achieved regardless of reference clock, power supply voltage, processing and temperature variations;

wherein the step of generating a digitally controlled oscillator (DCO) control code in response to the phase error code via the digital controller comprises the step of mapping the phase error code into delay time units in response to predetermined lookup table information.

22. A method of calibrating a time digitizer (T2D) delay associated with a digitally controlled oscillator (DCO) clock cycle, the method comprising the steps of:

providing a digitally controlled phase locked loop (PLL) comprising a phase frequency detector, a time digitizer, a digital controller, and a DCO;

setting a DCO code at a pre-determined code;

measuring a corresponding T2D code associated with the pre-determined DCO code, to generate a ratio;

generating normalized calibration data to determine how fast a subsequent DCO code should change in response to a T2D delay; and calibrating the T2D delay versus the DCO clock cycle to provide a general purpose, wide band PLL having a large input and output frequency range, and further having a loop bandwidth optimized to reject power supply and ground noise, and further being substantially immune to process, voltage and temperature variations.

* * * * *